United States Patent [19]
Yen

[11] Patent Number: 5,174,043
[45] Date of Patent: Dec. 29, 1992

[54] MACHINE AND METHOD FOR HIGH VACUUM CONTROLLED RAMPING CURING FURNACE FOR SOG PLANARIZATION

[75] Inventor: Daniel L. W. Yen, Taipei, Taiwan

[73] Assignee: Taiwan Semiconductor Manufacturing Company, Hsinchu, Taiwan

[21] Appl. No.: 824,231

[22] Filed: Jan. 21, 1992

Related U.S. Application Data

[62] Division of Ser. No. 618,199, Nov. 19, 1990, Pat. No. 5,106,787.

[51] Int. Cl.⁵ .................. F26B 5/04; H01L 21/469
[52] U.S. Cl. ........................ 34/15; 437/231; 437/235; 437/236; 437/248; 437/228; 34/92
[58] Field of Search ................... 34/15, 92, 5, 62; 437/228, 231, 235, 236, 248

[56] References Cited

U.S. PATENT DOCUMENTS

| | | | |
|---|---|---|---|
| 4,619,839 | 10/1986 | Lehrer | 427/82 |
| 4,721,548 | 1/1988 | Morimoto | 456/657 |
| 4,775,550 | 10/1988 | Chu et al. | 427/38 |
| 4,816,081 | 3/1989 | Mehta et al. | 34/92 |
| 4,826,709 | 5/1989 | Ryan et al. | 437/231 |
| 4,885,262 | 12/1989 | Ting et al. | 437/231 |
| 5,003,062 | 3/1991 | Yen | 437/238 |
| 5,115,576 | 5/1992 | Roberson, Jr. et al. | 34/92 |

OTHER PUBLICATIONS

Gupta et al; "Interlevel Dielectric planarization with Spin-on-glass films"; V-MIC conference; Jun. 1986; pp. 506-515.

Yen et al.; "Defect integration with spin-on-glass sandwich as an Intermetal Dielectric Layer for 1.2 Micrometer CMOS DLM process"; V-MIC Conference; Jun. 13-14, 1988; pp. 85-94.

Forester et al; "SOE planarization for polysilicon and first metal interconnect in a one micron CMOS process"; V-MIC Confer.; Jun. 1988; pp. 72-79.

Primary Examiner—Henry A. Bennet
Assistant Examiner—Denise L. F. Gromada
Attorney, Agent, or Firm—George O. Saile

[57] ABSTRACT

An apparatus is described for vacuum degassing and curing a spin-on-glass layer on an article. The machine has a chamber into which an article, such as at least one or more semiconductor wafers are moved by appropriate means. Means are provided for causing the chamber to be evacuated and for continuing to maintain the vacuum at less than about 100 mtorr. The temperature of the article is maintained at a substantially constant level within a first range of temperature by appropriate means during the vacuum degassing. Means are provided to ramping the temperature at a controlled rate from the first range of temperature up to the desired second range of temperature for curing of the spin-on-glass layer. The temperature of the article is maintained at a substantially constant level within the second range of temperature by suitable means for the curing. Means are provided to allow a constant inert gas flow to fill the chamber under the vacuum conditions during the operation. Means are provided for cooling the chamber and the article.

12 Claims, 1 Drawing Sheet

5,174,043

MACHINE AND METHOD FOR HIGH VACUUM CONTROLLED RAMPING CURING FURNACE FOR SOG PLANARIZATION

This application is a division of U.S. Ser. No. 07/618,199 filed on Nov. 19, 1990, now U.S. Pat. No. 5,106,787.

RELATED APPLICATION (1) U.S. patent application Ser. No. 07/512,401 filed Apr. 19, 1990 by the same inventor Daniel L. W. Yen. U.S. (2) U.S. patent application Ser. No. 07/615,377 filed by the same inventor Daniel L. W. Yen.

BACKGROUND OF THE INVENTION (1) Field of the Invention

The invention relates to a machine and method for vacuum degassing, controlled ramping to the curing temperature, and curing of a spin-on-glass (SOG) planarization layer for an integrated circuit device.

(2) Description of the Prior Art

The growing and regrowing of insulating films such as silicon dioxide and the use of polysilicon and/or metals in the form of conductors, ohmic contacts, resistors and the like in the manufacture of integrated circuits cause irregular or substantially non-planar surfaces across the surface of the semiconductor substrate. A major problem that is caused by these irregular or non-planar surfaces is loss of resolution in the lithographic masking processed. For example, metal conductors formed on the insulating films have different widths across the surface of the semiconductor body due to the different resist development because of the resolution problems. To prevent conductors from having varying widths to the point where they might cause short circuits, extra spacing or tolerances are required with each conductor. The increased tolerances reduce the number of devices that may be formed in the semiconductor structure. This problem increases with each higher level of metallurgy and with the use of submicron lithography features. In these highly dense, submicron integrated circuits 3 or 4 levels of interconnection metallury is required.

These problems have been recognized in the prior art and attempts have been made to overcome these topographical problems principally in the one micron and above feature dimensions. These techniques can be generally grouped in categories of planarization either involving etchback or nonetchback techniques. Examples of such processes are shown in the S. Morimoto U.S. Pat. No. 4,721,548; W. I. Lehrer U.S. Pat. No. 4,619,839; J. K. Chu et al. U.S. Pat. No. 4,775,550; V. W. Ryan et al U.S. Pat. No. 4,826,709 and C. T. Ting et al. U.S. Pat. No. 4,885,262.

The copending patent applications Ser. No. 07/512,401 now U.S. Pat. No. 5,003,062 entitled "Semiconductor Planarization Process for Submicron Devices" and Ser. No. 07/615,377 entitled "Planarization Process for IC Submicron Devices" By Daniel L. W. Yen the same author of the present invention describe methods to overcome the problems involving outgassing in the nonetchback type of planarization process for both silicate and siloxane type of spin-on-glass types of materials. These new inventions have made it necessary to design and develop a new machine and method for high vacuum, controlled ramping curing furnace which allows successful vacuum degassing and curing of a spin-on-glass layer within the same machine.

It is therefore a primary object of this invention to provide a machine and method for a high vacuum, controlled ramping vacuum degassing and curing of a spin-on-glass layer to complete the planarization of an integrated circuit device.

SUMMARY OF THE INVENTION

In accordance with the present invention, an apparatus is described for vacuum degassing and curing a spin-on-glass layer on an article. The machine has a chamber into which an article, such as at least one or more semiconductor wafers are moved by appropriate means. Means are provided for causing the chamber to be evacuated and for continuing to maintain the vacuum at less than about 100 mtorr. The temperature of the article is maintained at a substantially constant level within a first range of temperature by appropriate means during the vacuum degassing. Means are provided to ramping the temperature at a controlled rate from the first range of temperature up to the desired second range of temperature for curing of the spin-on-glass layer. The temperature of the article is maintained at a substantially constant level within the second range of temperature by suitable means for the curing. Means are provided to allow a constant inert gas flow to fill the chamber under the vacuum conditions during the operation. Means are provided for cooling the chamber and the article.

Further in accordance with the invention, a method for vacuum degassing and curing a spin-on-glass layer on a integrated circuit wafer is shown. A chamber is provided. At least one wafer is moved into the chamber to be subjected to vacuum degassing and curing. A vacuum of less than about 100 mtorr. is provided in the chamber. The temperature of said wafer is maintained at a substantially constant level within a first range of temperature between about 250° to 350° C., during the vacuum degassing. The temperature is ramped at a controlled rate from the first range of temperature up to the desired second range of temperature for the desired curing. The temperature of wafer is maintained at a substantially constant level within the second range of temperature between about 350° to 500° C. during the curing step. A constant inert gas flow is provided to fill the chamber under the vacuum conditions during operations. The chamber and the wafer are then cooled to room temperature.

DESCRIPTION OF THE PREFERRED EMBODIMENTS

The spin-on-glass materials and how they are processed are critical to the success of the process for planarization of integrated circuits as described in the above cited pending Patent Applications of Daniel L.

W. Yen. The most useful materials are silicates-Si(OH)$_4$ and siloxanes-(RO)$_n$Si(OH)$_{4-n}$. These types of materials are generally known and available examples of the silicate type is OCD Type 2 made by Tokyo Okha Corp. and siloxane type is OCD Type 6 made by Tokyo Okha Corp. Each spin-on-glass coating is less than about 0.3 micrometers and preferably between about 0.08 and 0.2 micrometers. The more coatings that are used, the better the planarity. The material to be applied is thoroughly mixed in a suitable solvent which is usually a combination of a high boiling point solvent and a low boiling point solvent.

The preferred low boiling point solvents are methanol, ethanol, and propanol. The middle boiling point solvents are buthanol, penthanol, hexanol and methyl celloslve. The high boiling point solvents are butyl cellosolve, propylene glycol, diethylene glycol and Carbindol. Other potential vehicles or solvents are NMP, HMPA, N,N-dimethylacetoamide, acetyl acetone, and malonic acid diethylester and the like.

The spin-on-glass material suspended in the vehicle or solvent is deposited onto the semiconductor wafer surface and uniformly spread thereover by the action of spinning the wafer. The material fills the indentations in the integrated circuit wafer surface, that is planarization. Most of the vehicle or solvent is driven off by a low temperature baking step. At this point, the critical vacuum degassing step is accomplished by subjecting the wafer to a vacuum of less than about 100 mtorr and 350 degrees C. This last step removes chemical materials which could during latter processing cause cracking and corrosion of the next level conductor material. Other coatings of the spin-on-glass material are applied, baked and vacuum degassed until the desired spin-on-glass layer is formed.

The final step in the making of the spin-on-glass layer is curing. Curing is a high temperature heating step to cause the breakdown of the silicate or siloxane material to a silicon dioxide like cross linked material. Water in the form of steam is the major reaction product of this reaction. The silicate spin-on-glass is cured at about 390 degrees C. and siloxane spin-on-glass is cured at about 450 degrees C. in nitrogen.

Figure 1:
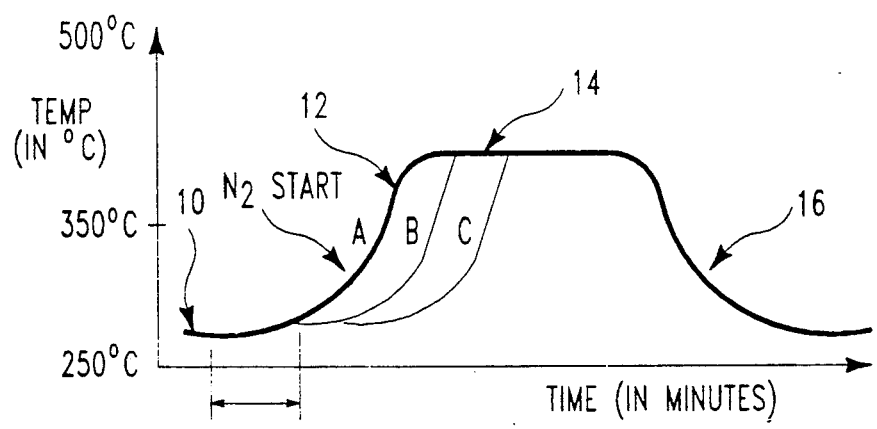
FIG. 1 graphically illustrates the operation of the vacuum degassing and curing apparatus of the present invention.
Figure 2:
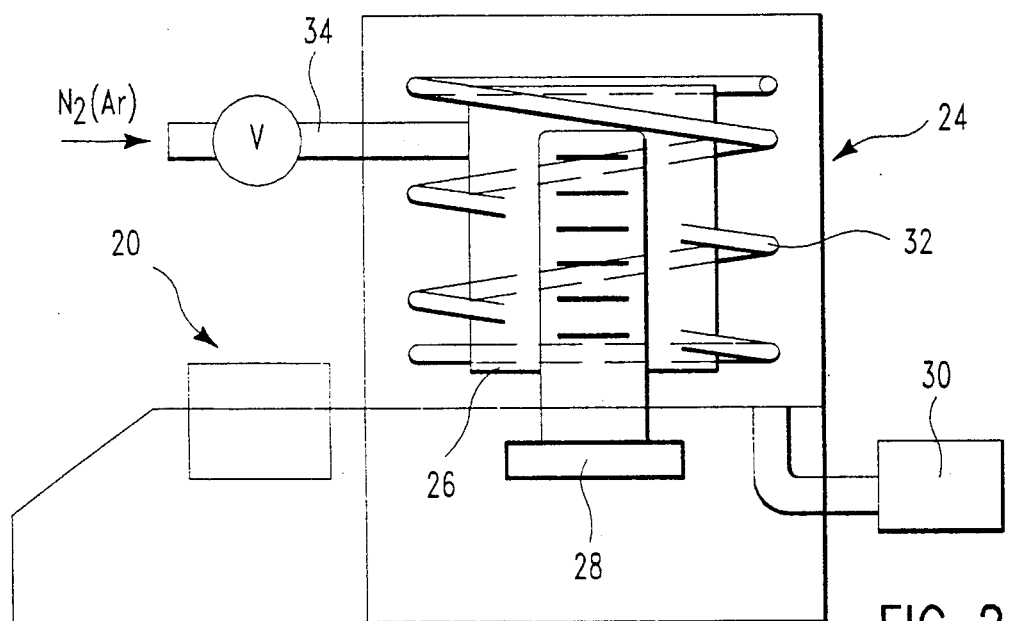
FIG. 2 schematically illustrate the construction and method of operation of the vacuum degassing and curing apparatus of the invention.

Referring now more particularly to FIG. 1, there is shown the operation of the vacuum degassing and curing steps of the apparatus of the invention. FIG. 2 schematically shows the apparatus 24 itself. Articles, such as semiconductor wafers having a planarizing spin-on-glass layer thereon are carried to the apparatus in a cassette 20. One or many of these wafers may be carried in this cassette 20. Conventional mechanizisms unload these wafers within the apparatus and load them into the furnace quartz boat 28 as is seen loaded with wafers and located in the chamber 26 of the apparatus 24 in the FIG. 2. A vacuum pump 30, associated piping and other equipment are connected to the chamber 26 to provide a vacuum of less than about 100 mtorr. in the chamber. Means 32 are provided for heating the chamber. Other control means (not shown) are provide for maintaining the temperature of the wafer in the chamber at a substantially constant level within a first range of temperature during the vacuum degassing. This control means also allows ramping the temperature of at a controlled rate from the first range of temperature up to the desired second range of temperature for the curing step. This control means then maintains the temperature of the wafer and chamber at a substantially constant level within the second range of temperature during this curing step. Means, including valves, piping and controls 34 provide a constant inert gas flow to fill the chamber 26 under the vacuum conditions during operation. Cooling means are provided to cool the chamber and wafer to room temperature. The cooling can be done by either use of cooling water through the heat exchange structure or by using a gas such as Helium passing through the gas heat exchanger.

Figure 3:
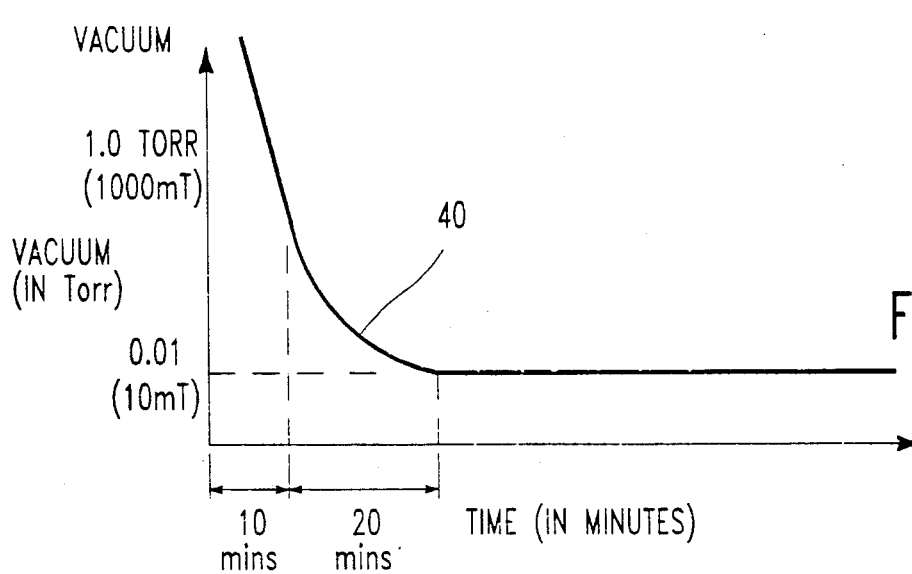
FIG. 3 graphically illustrates the vacuum used during the operation of the vacuum degassing and curing apparatus of the invention.

The operation of the apparatus 24 may be better seen with reference to the FIG. 1 which shoes the graphical representation in time versus temperature to which the apparatus operates. Also, the FIG. 3 shows the graphical representation in time versus vacuum to which the apparatus operates. After the wafer(s) each with a spin-on-glass layer thereon and which have been baked are described above to remove the vehicle, are positioned in the chamber the process may begin.

The vacuum pump is turned on and the vacuum in the chamber 26 is made, for example by the FIG. 3 graphical representation. In any case it is necessary to have an efficient vacuum system that is able to pull the vacuum of less than about 100 mTorr. and preferably less than 10 mtorr. in less than about 30 minutes as is shown in FIG. 3. During this time the heating means 32 together with its associated control means operate to bring the temperature into the first range of temperature for vacuum degassing of the spin-on-glass layer on each wafer. This preferred range is between about 250° to 350° C. This temperature range is sufficient to remove the trapped gases in the spin-on-glass layer that the low temperature cannot remove. This time period is shown in FIG. 1 in the part of the curve marked 10.

The next part 12 of the operation curve involves ramping the temperature at a controlled rate from the first range of temperature up to the desired second range of temperature for curing. Control means are provided to raise the temperature at a steady ramping rate of about 1° C./minute or more. It is important that the ramping temperature is raised at the constant rate because the silicate glass tends to crack once the stress of it bulilds up at an unacceptable rate. During the rise in temperature, as indicated in the operation curve nitrogen, N$_2$ or Argon is started to flow into the chamber. It is flowed into the chamber starting at this time because a convection type of heat transfor is preferred for the curing of silicate SOG. It continues to flow into the chamber through the cooling cycle. The nitrogen or other inert gas such as argon is flowed into the chamber at a flow rate of at least 10 sccm per minute. The ramping part 12 of the operating curve can take one of many curves. For example, curves A, B, and C are alternative ramping curves. The particular curve to be used depends upon the type, whether siloxane or silicate of sin-on-glass used and the thickness of the spin-on-glass layer or layers. For example, the A curve increases at about 5° C. per minute and would be the curve used for siloxane type of spin-on-glass. For silicate spin-on-glass types, the curves B and C are used depending upon the silicate type and its thickness.

The next part 14 of the operating curve is the curing of the spin-on-glass layer on each wafer timer period. The temperature of the wafer is maintained at a substantially constant level within the second range of temperature. The preferred temperature is between about 350° to 500° C. During this curing part 14 of the operating curve is when crosslinking of the silicate or siloxane type molecules and these molecules are stabilized. It is important that the vacuum continues during this part 14 of the operating curve, because it provides the efficient way of degassing to avoid the poison via problem in the subsequent process steps. Even higher curing temperatures are useful if the metal layers in the integrated circuit is uneffected by the temperatures. However, the usual metal used is aluminum integrated circuits and the temperature must be limited to below about 500° C.

The final part 16 of the operating curve is the cooling period of the wafers and the chamber to between about 100° to 300° C. The means for cooling the wafer(s) to this desired temperature range may be provided by either cooling water through the heat exchanger or by using a gas, such as Helium in the gas heat exchanger.

In order to more fully understand FIG. 1, the times for the parts of the curve 10, 12, 14 and 16 must be generally understood. The minimum time needed for part 10 of the curve for degassing is at least 15 minutes. It is preferred that the time be even longer. The time, of course depends upon the type of spin-on-glass used and the thickness of the layer or layers. The part 12 of the curve for ramping has its ramping rate chosen depending upon the type and thickness of the spin-on-glass and its thickness. The time needed for part 12 is decided by the temperature difference between the curve parts 10 and 14. The curving part 14 of the curve should be at least 15 minutes and preferably longer. The final part 16 of the curve for cooling is not critical and can take whatever time needed depending upon equipment needs.

While the invention has been particularly shown and described with reference to the preferred embodiments thereof, it will be understood by those skilled in the art the various changes in form and details may be made without departing from the spirit and scope of the invention.

What is claimed is:

1. A vacuum degassing and curing apparatus comprising: a chamber;
   means for moving at least one article to be subjected to vacuum degassing and curing into said chamber;
   means for providing a vacuum of less than about 100 mtorr. in said chamber;
   means for maintaining the temperature of said article at a substantially constant level within a first range of temperature during the said vacuum degassing;
   means for ramping the temperature at a controlled rate from the said first range of temperature up to the desired second range of temperature for said curing;
   means for maintaining the temperature of said article at a substantially constant level within said second range of temperature during the said curing;
   means for providing a constant inert gas flow to fill said chamber under the vacuum conditions during operation; and
   means for cooling said chamber and said article.

2. The apparatus of claim 1 wherein said first range of temperature is between about 250° to 350° C. and said second range of temperature is between about 350° to 500° C. and the maintenance of said temperature at said constant value is within about plus/minus 3° C.

3. The apparatus of claim 1 wherein the said article is at least one semiconductor wafer having a spin-on-glass layer thereon and said means for moving said article into said chamber includes a cassette to carry said at least one wafer.

4. The apparatus of claim 3 wherein said means for moving said article into said chamber includes means for transporting a plurality of wafers from the cassette to a quartz boat and then into said chamber within said quartz boat.

5. The apparatus of claim 1 wherein said means for ramping the temperature at a controlled rate is at a rate of between about 1° to 10° C. per minute.

6. The apparatus of claim 1 wherein the said means for providing a constant inert gas flow includes a flow rate at least about 10 sccm. per minute and the gas is nitrogen.

7. The apparatus of claim 1 wherein the said means for cooling said chamber and article include passing cooling water through a heat exchanger.

8. A vacuum degassing and curing apparatus for degassing and curing a spin-on-glass layer on a integrated circuit wafer comprising:
   a chamber;
   means for moving at least one said wafer to be subjected to vacuum degassing and during into said chamber; means for providing a vacuum of less than about 100 mtorr. in said chamber;
   means for maintaining the temperature of said wafer at a substantially constant level within a first range of temperature between about 250° to 350° C. during the said vacuum degassing;
   means for ramping the temperature at a controlled rate from the said first range of temperature up to a desired second range of temperature for said curing;
   means for maintaining the temperature of said wafer at a substantially constant level within said second range of temperature between about 350° to 500° C. during the said curing;
   means for providing a constant inert gas flow to fill said chamber under the vacuum conditions during operation; and,
   means for cooling said chamber and said wafer.

9. The apparatus of claim 8 wherein said means for moving said article into said chamber includes means for transporting a plurality of wafers from a cassette to a quartz boat and then into said chamber within said quartz boat.

10. The apparatus of claim 8 wherein said means for ramping the temperature at a controlled rate is at a rate of between about 1° to 10° C. per minute.

11. The apparatus of claim 8 wherein the said means for providing a constant inert gas flow includes a flow rate of at least about 10 sccm per minute and the gas is nitrogen.

12. The apparatus of claim 8 wherein the said means for cooling said chamber and article include passing Helium gas through the chamber while using cooling water through a heat exchanger.

* * * * *